United States Patent
Xu

(10) Patent No.: US 6,169,430 B1
(45) Date of Patent: *Jan. 2, 2001

(54) CMOS IMAGER COLUMN BUFFER GAIN COMPENSATION CIRCUIT

(75) Inventor: Weize Xu, Rochester, NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/059,966

(22) Filed: Apr. 14, 1998

(51) Int. Cl.[7] ...................................................... H03K 3/00
(52) U.S. Cl. ........................ 327/108; 327/112; 327/437
(58) Field of Search ........................... 327/108–112, 427, 327/434, 436, 437, 491

(56) References Cited

U.S. PATENT DOCUMENTS

| | | | |
|---|---|---|---|
| 4,145,579 | 3/1979 | Angner et al. ........................... | 179/81 |
| 4,446,411 | 5/1984 | Song ........................................ | 318/696 |
| 4,843,325 * | 6/1989 | McKee, Jr. .............................. | 324/439 |
| 5,006,814 * | 4/1991 | Wilson .................................... | 330/107 |
| 5,201,023 | 4/1993 | Motzko ................................... | 388/824 |
| 5,399,994 | 3/1995 | Siniscalchi et al. .................... | 331/17 |
| 5,625,325 | 4/1997 | Rotzoll et al. .......................... | 331/16 |
| 5,659,516 * | 8/1997 | Casagrande et al. .................. | 365/226 |
| 5,731,713 * | 3/1998 | Proebsting et al. .................... | 326/71 |
| 5,764,755 * | 6/1998 | Chen ....................................... | 379/399 |
| 5,892,390 * | 4/1999 | Tobita .................................... | 327/543 |

* cited by examiner

*Primary Examiner*—Kenneth B. Wells
(74) *Attorney, Agent, or Firm*—James D. Leimbach

(57) ABSTRACT

A CMOS imager is arranged in a plurality of rows and columns with a gain compensation circuit supplied for each of the column. The gain compensation circuit has a first source follower circuit that employs majority carriers of a first polarity yielding a first voltage gain, and a second source follower circuit employing majority carriers of second polarity opposite the first polarity yielding a voltage gain that is essentially the opposite of the first voltage gain variation as compared to the input voltage. The input to the second source follower circuit that is electrically coupled to the output of the second source follower circuit resulting in a gain compensation between the first and second source follower circuits. A selection circuit is configured to enable the gain compensation circuit upon activation of a column select signal.

19 Claims, 5 Drawing Sheets

US 6,169,430 B1

CMOS IMAGER COLUMN BUFFER GAIN COMPENSATION CIRCUIT

FIELD OF THE INVENTION

The present invention relates to electronic amplifiers, and more particularly, to linear gain amplifiers that can be conveniently employed by CMOS based solid state image sensors.

BACKGROUND OF THE INVENTION

Present applications, including electronic imaging systems, electronic printings, accurate measurement systems, data acquisition systems, automatic control systems and others, require high resolution signal/data processing. Circuits employing source followers are widely used in IC designs within these systems because of the relatively small size of these circuits. Additionally these circuits have low output resistance and good frequency response. Electronic imagers in the form of solid-state sensors made from a standard CMOS process can employ both analog and digital circuits integrated within the sensor array on the same silicon chip.

Process variations (which are inherent to any process and can not be eliminated) present problems for solid state imagers that are arranged in an array of rows and columns because offsets exist between the columns as a result of these process variations. These offsets generate what called is typically referred to in the art as "fixed column pattern noise". The "fixed column pattern noise" must be removed before analog to digital conversion is accomplished. For any array that is arranged in columns, an individual output buffer (source follower) is required for each column. Both PMOS and NMOS source followers have voltage gains that change with the input signal levels. The buffer voltage gain variations make high resolution (8-bit or higher) systems virtually impossible without a technique that can greatly improve the output linearity of these output buffers.

From the foregoing discussion, is should be apparent that there remains a need within the art for an output buffer circuit that has improved linearity over those existing within the prior art.

SUMMARY OF THE INVENTION

A CMOS imager is arranged in a plurality of rows and columns with a gain compensation circuit supplied for each of the columns. The gain compensation circuit has a first source follower circuit that employs majority carriers of a first polarity yielding a first voltage gain as a function of its input voltage, and a second source follower circuit employing majority carriers of second polarity opposite the first polarity yielding a voltage gain that is essentially the opposite of the first voltage gain variation as compared to its input voltage. The input to the second source follower circuit that is electrically coupled to the output of the second source follower circuit resulting in a gain compensation between the first and second source follower circuits. A selection circuit is configured to enable the gain compensation circuit upon activation of a column select signal.

The output buffer voltage gain compensation circuit of the present invention uses both PMOS source follower amplifiers and NMOS source follower amplifiers that have, essentially, opposite voltage gain characteristics resulting in the input to each changing opposite directions. The preferred embodiment employs a PMOS source follower proceeds an NMOS source follower. By properly setting the biasing current and transistor sizes, the overall variability of the voltage gain of this circuit can be controlled to be less than 0.3%.

The above and other features and advantages of the invention are provided by a voltage gain compensation circuit comprising: a first amplifier configuration having a first set of gain characteristics; a second amplifier configuration having a second set of gain characteristics, the second amplifier being electrically coupled to the first amplifier; and wherein the first set of gain characteristics and the second set of gain characteristics are essentially opposite.

DETAILED DESCRIPTION OF THE INVENTION

Figure 1:
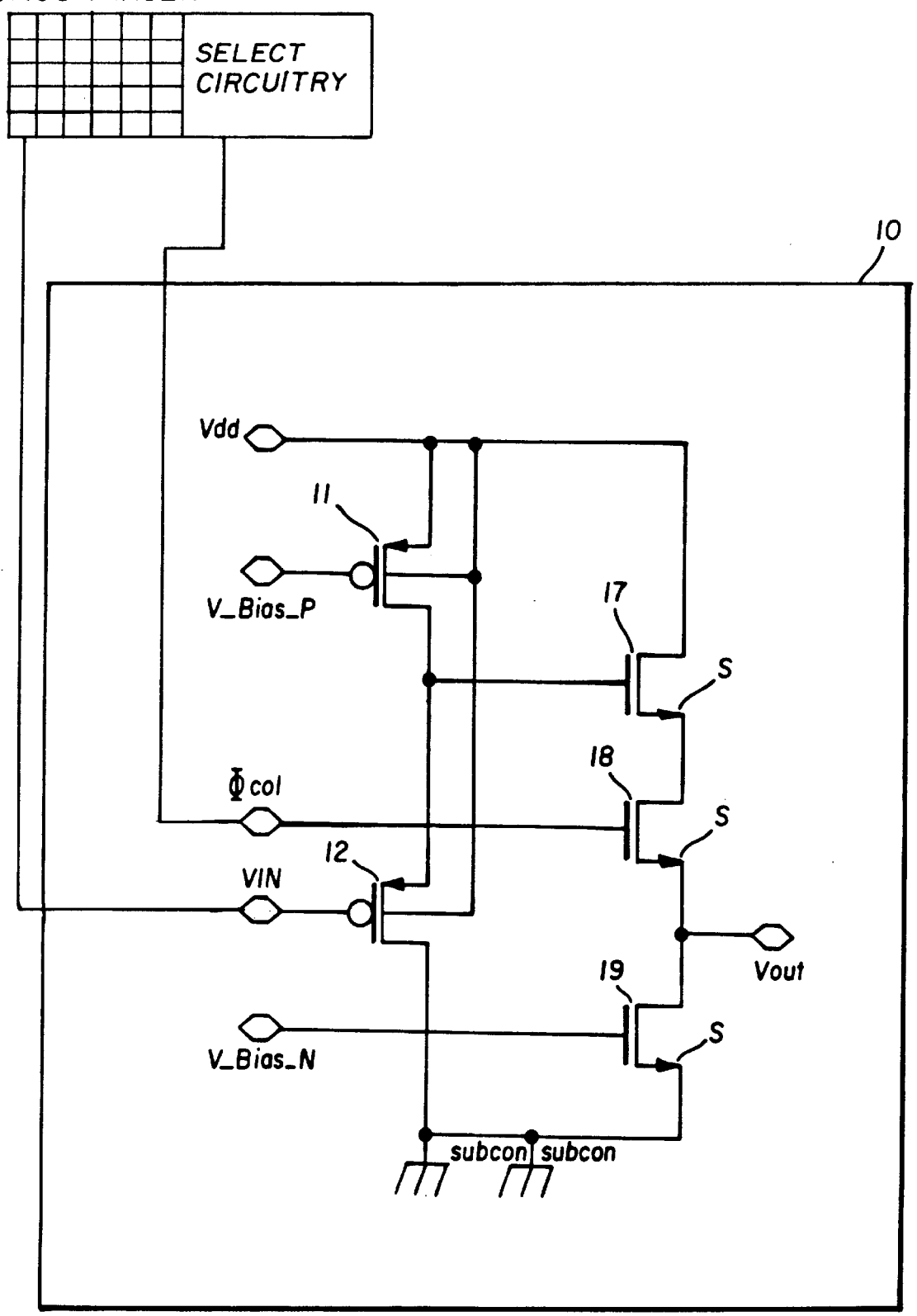
FIG. 1 is a schematic diagram of a CMOS Gain Compensation Circuit as envisioned by the present invention.

The voltage gain compensation circuit 10 of the present invention is illustrated schematically in FIG. 1 and comprises a PMOS source follower PMOS transistor 12 having PMOS transistor as a biasing transistor for PMOS transistor 12 11 and an NMOS source follower having NMOS transistors 17, and 18. The input to the voltage gain amplifier is the Vin input to the gate of transistor 12 in the PMOS source follower. The output to the voltage gain amplifier 10 is at Vout of the NMOS source follower, at the drain of transistor 19. Biasing voltages are applied to the voltage gain amplifier 10 at the gate of biasing transistor 19 by $V_{BIAS\_N}$. The value of the D.C. voltage that is applied as a biasing voltage is a function of the power supply voltage, the actual size of the NMOS transistors used and the input voltage $V_{IN}$ to the source follower.

Still referring to FIG. 1, $V_{BIAS\_P}$ provides the biasing to the PMOS source follower at the gate of PMOS transistor 11. This is a D.C. biasing level that is selected based on power supply voltage, of the actual size of the PMOS transistors used and of the input voltage, $V_{IN}$, applied to the PMOS source follower.

Each of the PMOS and the NMOS source followers has a voltage gain, $A_v$, as shown by Equation 1 below defined in terms of resistance between the drain and the source, $r_{ds}$ and transconductance for the input transistor, $g_{m1}$, and the leaking transconductance for the input transistor $g_{mb1}$.

$$A_v = \frac{g_{m1}}{\frac{1}{r_{ds1}} + \frac{1}{r_{ds2}} + \left(1 + \frac{g_{mb1}}{g_{m1}}\right) \cdot g_{m1}} \quad \text{Equation 1}$$

where $$\frac{g_{mb1}}{g_{m1}} = \frac{\gamma}{2 \cdot \sqrt{2 \cdot \phi_f + V_{SB}}}$$

Here, γ is a process parameter that is typically supplied by the fabrication facility and is ideally equal to 0. Due to leakage by the transistor, however, the value for α is not equal to 0. $\phi_f$ is the silicon building potential parameter. $V_{SB}$ is the source to body potential.

The gain for the entire voltage gain amplifier is a constant because the variations in NMOS and the PMOS source followers are opposite and offset each other. $A_{TOTAL}$ is shown to be a constant defined by equation 2 below.

$$A_{TOTAL} = A_N * A_P = k_2 * k_1 \quad \text{Equation 2}$$

Here, both $A_N$ ad $A_P$ are defined by Equation 1 and further defined by Equation 2a and 2b below which illustrates that the gain, $A_p$, of the PMOS circuit is inversely proportional to the input voltage and the gain, $A_N$, of the NMOS circuit is directly proportional to the input voltage. Accordingly, the two gains $A_p$ and $A_N$ of the two circuit tend to cancel each other out resulting in a highly linear and consistent output.

$$A_p k_1 / V_{IN}; \text{ and} \quad \text{Equation 2a}$$

$$A_N V_{IN} k_2 \quad \text{Equation 2b}$$

For the NMOS source follower, the voltage gain variation comes from two facts. The first is that transistor terminals for the source, S and the body, B, can not be connected together to make Vsb a constant. Secondly a large current term 1/rds in the gain equation above can not be omitted. It should be noted that transistor 19 is not actually part of the NMOS source follower and functions only for biasing purposes. In FIG. 1 transistor 19 has the source S tied to the substrate voltage which effectively ties the source S to the body B; however, transistor 19 is a biasing transistor and does not affect the performance of the NMOS source follower in terms of gain.

Figure 2:
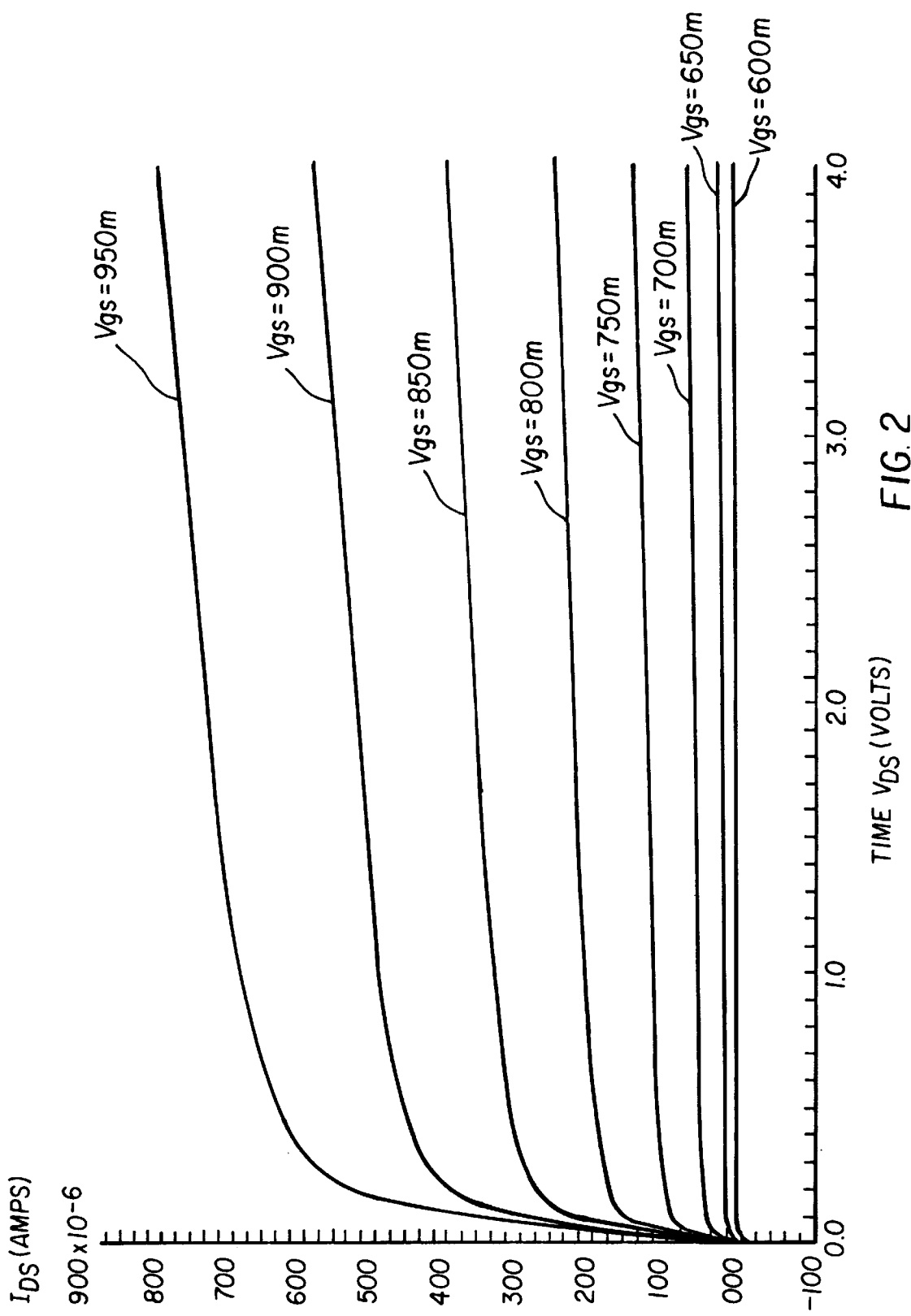
FIG. 2 illustrates the transistor characteristics for the NMOS transistor employed by the CMOS circuit in FIG. 1.
Figure 3:
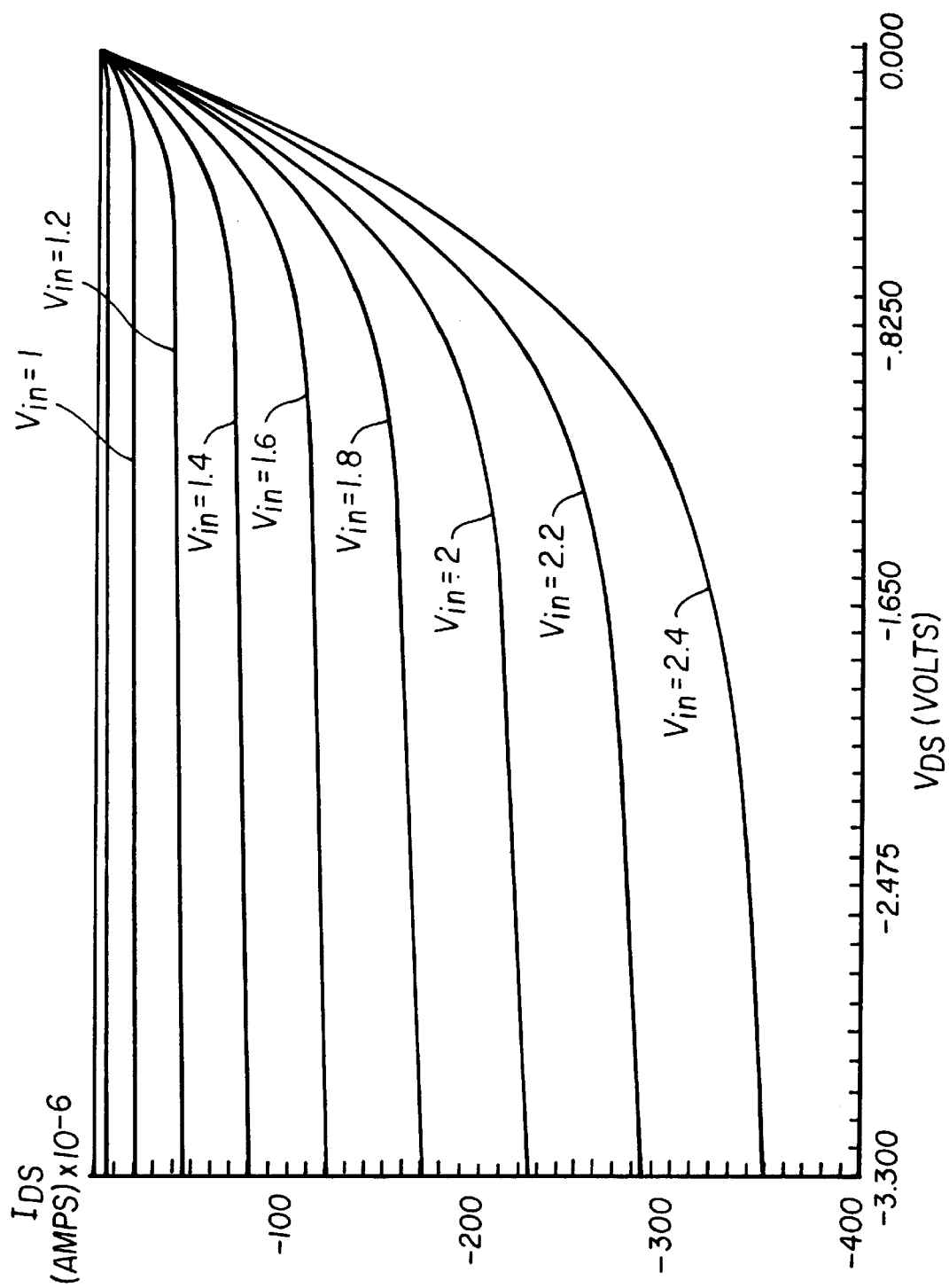
FIG. 3 illustrates the transistor characteristics for the PMOS transistor employed by the CMOS circuit in FIG. 1.

FIG. 2 illustrates the characteristic transistor curves for transistor 17. Transistor 17 is responsible for the gain variation in the NMOS source follower. Transistor 18 acts as a column select switch, and transistor 19 as a biasing transistor for the NMOS source follower. FIG. 2 shows how that the drain to source voltage for transistor 19 inversely proportional (1/rds) to the drain to source voltage ($V_{DS}$) for transistor 17. For the PMOS source follower, a similar but opposite analogy applies with transistor 11 being the biasing transistor and transistor 12 varying the input signal $V_{IN}$. The characteristic transistor curves for transistor 12 are illustrated in FIG. 3 and are an opposite reflection of those shown in FIG. 2. It is an important feature of the preferred embodiment that the characteristic transistor curves for transistors 12 and 17 compensate each other to yield a constant voltage gain at $V_{Out}$.

The transistor output resistance is shown by Equation 3 below.

$$r_0 = \left( \frac{\partial I_D}{\partial V_{DS}} \right)^{-1} \quad \text{Equation 3}$$

The voltage gain at different input is shown by Equation 4.

$$A = \left( \frac{d V_{OUT}}{d V_{IN}} \right)_{V_{in}} \quad \text{Equation 4}$$

Figure 4:
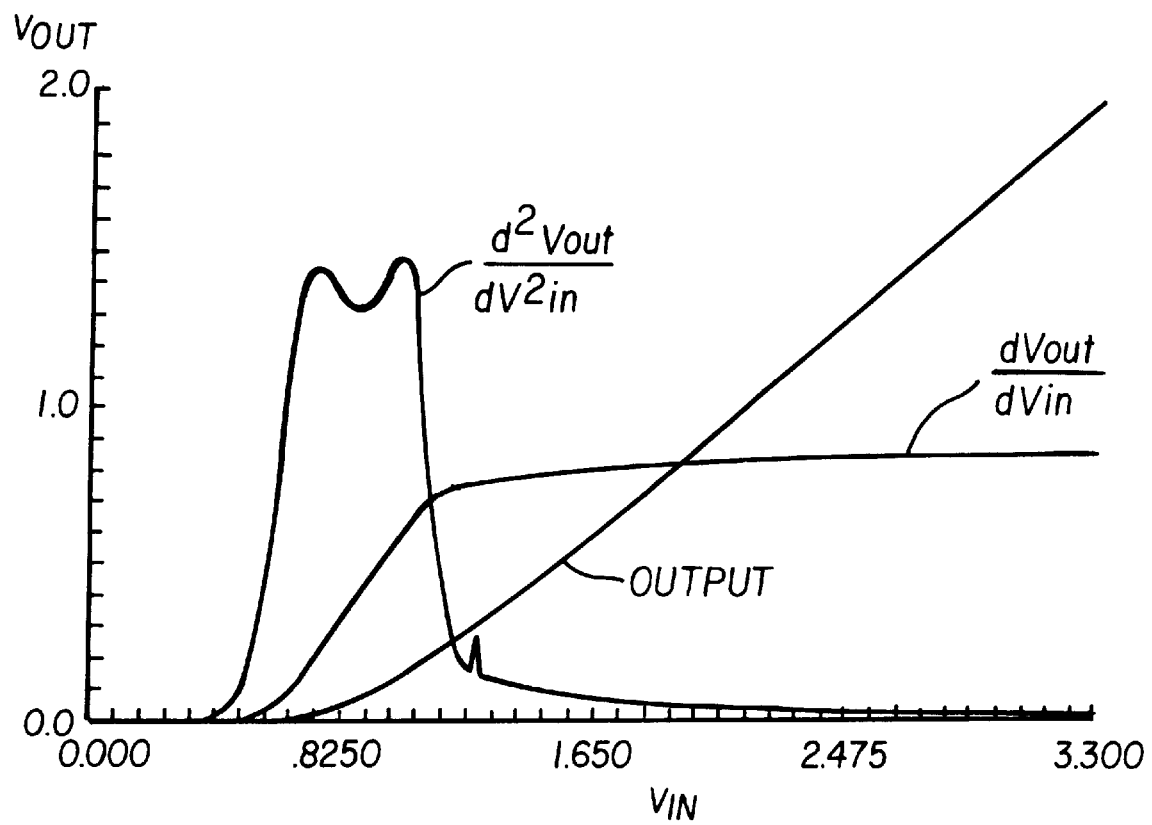
FIG. 4 illustrates the NMOS Source Follower Gain Variations for the CMOS circuit in FIG. 1.

For NMOS source follower, the voltage gain increases when input voltage increases as shown in FIG. 4. The operating range is selected to be linear and is based on the second order derivative $$\left( \frac{d^2 V_{out}}{d V_{in}^2} \right)$$

of the output to the NMOS source follower as seen in the voltage gain change curve in FIG. 4. As seen from FIG. 4, the NMOS source follower always has a positive $$\frac{d^2 V_{out}}{d V_{in}^2}$$

value which means the voltage gain always increase with the input voltage.

Figure 5:
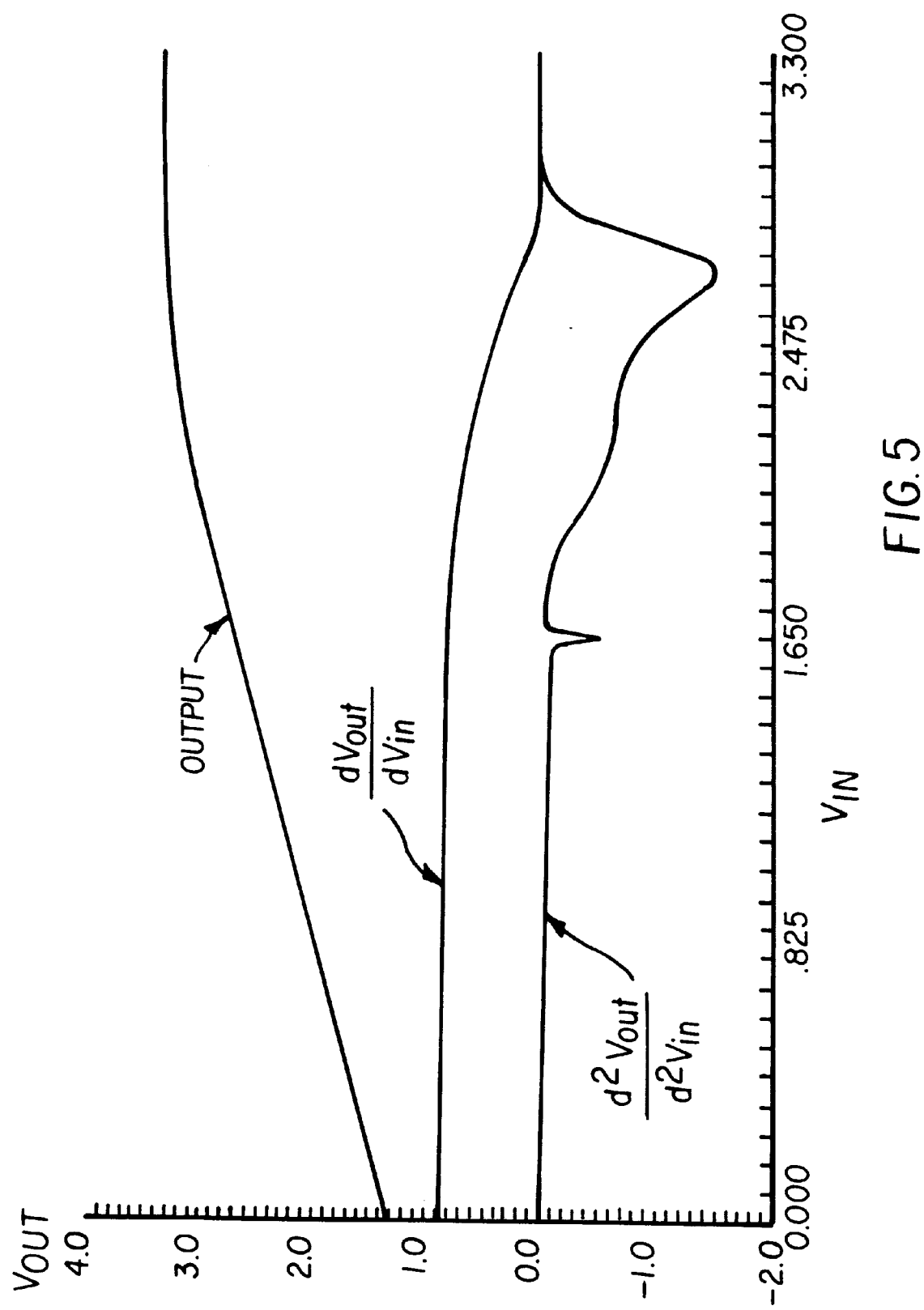
FIG. 5 illustrates the PMOS Source Follower Gain Variations for the CMOS circuit in FIG. 1.

For PMOS source follower as envisioned by the preferred embodiment, the voltage gain decreases when input voltage increases. From FIG. 5, it can be seen that the PMOS source follower always has a negative $$\frac{d^2 V_{out}}{d V_{in}^2}$$

value, which means the PMOS source follower has voltage gain decreasing with the input voltage, which is essentially the opposite of the NMOS source follower shown in FIG. 4. The reversed gain variation of the PMOS source follower is used in the preferred embodiment to compensate for the gain variation that is caused by the NMOS source follower. Simulations of the preferred embodiment, using a cadence spice simulator, have shown that the total voltage gain variation of the column buffer circuit improves from 10% before compensation typically employing only an NMOS source follower to less than 0.3% after compensation employing the PMOS source follower in combination with the NMOS source follower. The operation range of PMOS source follower, and the specific PMOS transistors employed are also selected based on the voltage gain changes as shown in FIG. 5. The specific use to which the linear gain amplifier is put will determine the actual size of the transistors. The preferred embodiment envisions employing small PMOS transistors that are fast switching and require less power in combination with large NMOS transistors that have the drive capability to handle the large capacitive load of a bus. However, numerous embodiments will be readily apparent to those skilled in the art wherein the relative configuration will change according to the use of the circuit involved.

The invention has been described in detail with particular reference to certain preferred embodiments thereof, but it will be understood that variations and modifications can be effected within the spirit and scope of the invention.

What is claimed is:

1. A voltage gain compensation circuit comprising:
    a first source follower amplifier configuration operating in saturated mode having a first set of gain characteristics;
    a second source follower amplifier configuration operating in saturation mode having a second set of gain characteristics, the second amplifier being electrically coupled to the first amplifier such that an output from the first amplifier circuit is an input to the second amplifier; and
    wherein the first set of gain characteristics and the second set of gain characteristics are essentially opposite.

2. The circuit of claim 1 wherein the first and second amplifiers further comprise respectively, a PMOS transistor for the first amplifier and an NMOS transistor for the second amplifier.

3. The circuit of claim 1 wherein each of the first and second amplifiers has a biasing potential applied to it.

4. The circuit of claim 1 wherein the first amplifier has a decreasing output for increasing input levels and the second amplifier has an increasing output for increasing input levels.

5. The circuit of claim 1 further comprising a select circuit operatively coupled to the gain compensation circuit.

6. The circuit of claim 1 wherein the gain compensation circuit further comprises an input to the first source follower and an output from the second source follower and a select circuit to enable the output upon input of a predetermined signal.

7. The circuit of claim 6 wherein the circuit further comprises a CMOS circuit.

8. The circuit of clam 7 further comprising a plurality of CMOS circuits each having a voltage gain circuit arranged such that only one of the voltage gain compensation circuits is selected at any given time.

9. A gain compensation circuit comprising:
- a first source follower circuit that employs majority carriers of a first polarity, the first source follower operating in saturation mode exhibiting a first gain characteristic;
- a second source follower circuit employing majority carriers of second polarity opposite the first polarity, the second source follower operating in saturation mode exhibiting a second gain characteristic that is different from the first gain characteristic;
- an input to the second source follower circuit that is electrically coupled to an output of the first source follower circuit;
- input biasing means for providing a biasing current to the first source follower circuit; and
- output biasing means for providing a biasing current to the second source follower circuit.

10. The circuit of claim 9 wherein the first source follower circuit further comprises a PMOS transistor and the second source follower circuit further comprises an NMOS circuit.

11. The circuit of claim 9 wherein the first gain characteristic of the first source follower provides a decreasing output voltage for increasing levels of input voltages and the second gain characteristic of the second source follower provides an increasing output voltage for increasing levels of input voltages.

12. The circuit of claim 9 further comprising a selection circuit configured to enable the gain compensation circuit upon activation of a selection signal.

13. The circuit of claim 12 wherein the selection circuit provides the selection signal to selectively enable or disable the output of the second source follower circuit.

14. A CMOS imager arranged in a plurality of rows and columns comprising:
- a gain compensation circuit for each of the columns, the gain compensation circuit having a first source follower circuit operating in saturation mode that employs majority carriers of a first polarity, and a second source follower circuit operating in saturation mode employing majority carriers of second polarity opposite the first polarity;
- an input to the second source follower circuit that is electrically coupled to an output of the second source follower circuit; and
- a selection circuit configured to enable the gain compensation circuit upon activation of a selection signal.

15. The CMOS imager of claim 14 wherein the first source follower circuit further comprises a PMOS transistor circuit and the second source follower circuit further comprises an NMOS transistor circuit.

16. The CMOS imager of claim 14 wherein the first gain characteristic of the first source follower provides a decreasing output voltage for increasing levels of input voltages and the second gain characteristic of the second source follower provides an increasing output voltage for increasing levels of input voltages.

17. The CMOS imager of claim 14 further comprising input biasing means for providing a biasing potential to the first source follower circuit.

18. The CMOS imager of claim 14 further comprising output biasing means for providing a biasing potential to the second source follower circuit.

19. The CMOS imager of claim 14 wherein the selection circuit provides the selection signal to selectively enable or disable the output of the second source follower circuit.

* * * * *